(12) United States Patent
Chen

(10) Patent No.: US 11,908,228 B2
(45) Date of Patent: Feb. 20, 2024

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Bi Chen, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 682 days.

(21) Appl. No.: 17/047,680

(22) PCT Filed: Jun. 30, 2020

(86) PCT No.: PCT/CN2020/099304
§ 371 (c)(1),
(2) Date: Oct. 14, 2020

(87) PCT Pub. No.: WO2021/253489
PCT Pub. Date: Dec. 23, 2021

(65) Prior Publication Data
US 2023/0121262 A1   Apr. 20, 2023

(30) Foreign Application Priority Data
Jun. 16, 2020 (CN) .......................... 202010546638.0

(51) Int. Cl.
*G06V 40/13* (2022.01)
*G02F 1/1333* (2006.01)
*G06F 3/041* (2006.01)

(52) U.S. Cl.
CPC ...... *G06V 40/1318* (2022.01); *G02F 1/13338* (2013.01); *G06F 3/0412* (2013.01)

(58) Field of Classification Search
CPC ............... G06V 40/1318; G06V 40/12; G02F 1/13338; G06F 3/0412; G06F 2203/04111; G06F 3/0446; G06F 3/0416; H10K 59/40
See application file for complete search history.

(56) References Cited

U.S. PATENT DOCUMENTS

2018/0101714 A1\* 4/2018 Lin .................... G02F 1/134309
2019/0019850 A1\* 1/2019 Xu ........................ G06V 40/12
(Continued)

FOREIGN PATENT DOCUMENTS

| CN | 104699320 A | 6/2015 |
|---|---|---|
| CN | 108021288 A | 5/2018 |

(Continued)

*Primary Examiner* — Alvaro E Fortich
(74) *Attorney, Agent, or Firm* — PV IP PC; Wei Te Chung; Zhigang Ma

(57) ABSTRACT

The present disclosure discloses a display panel and a display device. The display panel includes a display substrate, the display substrate includes a plurality of pixel units; and a touch layer and a fingerprint recognition layer disposed on the display substrate; wherein, the touch layer includes at least one touch unit; the fingerprint recognition layer includes at least one primary fingerprint recognition unit, each of the primary fingerprint recognition units includes $N_{SFPS}$ sub-fingerprint recognition units corresponding to $N_{pixel}$ pixel units, where $N_{SFPS}$, $N_{pixel}$ are positive integers.

19 Claims, 4 Drawing Sheets

(56) References Cited

U.S. PATENT DOCUMENTS

2020/0144334 A1\* 5/2020 Jang .................. H10K 59/1213
2021/0365169 A1\* 11/2021 Liu ....................... G06F 3/0443

FOREIGN PATENT DOCUMENTS

| CN | 110032303 A | 7/2019 |
| CN | 110427121 A | 11/2019 |
| WO | 2020040583 A1 | 2/2020 |

\* cited by examiner

DISPLAY PANEL AND DISPLAY DEVICE

This application is a National Phase of PCT Patent Application No. PCT/CN2020/099304 having international filing date of Jun. 30, 2020, which claims priority to Chinese Patent Application with the application No. 202010546638.0 filed on Jun. 16, 2020 with the National Intellectual Property Administration, the disclosure of which is incorporated by reference in the present application in its entirety.

FIELD OF INVENTION

The present disclosure relates to the field of touch technologies, and more particularly, to a display panel and a display device.

BACKGROUND OF INVENTION

At present, two mainstream touch screen application methods are a out-cell touch type and a direct on-cell touch type (DOT): The out-cell type is that a touch sensor is designed as an individual module, and placed between a cover and a display; the direct on-cell touch type is that the touch sensor is designed on the display, and then attached beneath the cover together with the display. Moreover, with developments of display technologies, mobile phones as important communication tools are indispensable in daily life. In related technologies, a fingerprint reader as an individual module is placed in a non-display area, such as on a front lower bezel, lateral sides or a back. All the fingerprint reader for the above schemes are assembled as an individual module.

How to dispose a fingerprint recognition module on the on-cell touch screen has become a difficulty in the technology. After the fingerprint recognition module is disposed on the on-cell touch screen, distances between adjacent pixel units of the high-resolution product are too small, which leads to distances between adjacent fingerprint recognition units are also too small. However, if the distances between adjacent said fingerprint recognition units are too small, the sensing amount will be too short, and cannot pass through a thick cover, and the recognition effect will be poor. Similarly, if the distances between said adjacent fingerprint recognition units are too large, fingerprint recognition resolution will be too low, and fingerprint recognition accuracy will be low. Moreover, straight line metal bridges are not suitable for pearl type pixel units and have technical defects, such as impacts on light emission of the pixel units, which need to be solved instantly.

Technical Problems

In the prior art, there are technical problems that it is difficult to dispose the fingerprint recognition module on the on-cell touch screen, the fingerprint recognition effect is poor, the fingerprint recognition accuracy is low, and the pixel light emission is affected after the disposition.

SUMMARY OF INVENTION

Technical Solutions

The embodiments of the present disclosure provide a display panel and a display device, which are used to solve the problems that it is difficult to dispose the fingerprint recognition module on a on-cell touch screen, and the fingerprint recognition effect is poor, the fingerprint recognition accuracy is low, and the pixel light emission is affected after the disposition.

To solve the above problems, in a first aspect, the present disclosure provides a display panel, including: a display substrate, the display substrate including a plurality of pixel units; and a touch layer and a fingerprint recognition layer disposed on the display substrate; wherein, the touch layer includes at least one touch unit; the fingerprint recognition layer includes at least one primary fingerprint recognition unit, and each of the primary fingerprint recognition units includes $N_{SFPS}$ sub-fingerprint recognition units corresponding to $N_{pixel}$ said pixel units, where $N_{SFPS}$ and $N_{pixel}$ are positive integers.

In some embodiments of the present disclosure, the touch layer and the fingerprint recognition layer are disposed in the same layer.

In some embodiments of the present disclosure, a distance between adjacent said touch units is from 5 millimeters to 20 millimeters, and a distance between adjacent said sub-fingerprint recognition units is from 50 micrometers to 150 micrometers.

In some embodiments of the present disclosure, a distance $P_{UFPS}$ between adjacent said primary fingerprint identification units satisfies $P_{UFPS}=N_{pixel} \times P_{pixel}$ or $P_{UFPS}=N_{SFPS} \times P_{SFPS}$, and a difference between $N_{pixel} \times P_{pixel}$ and $N_{SFPS} \times P_{SFPS}$ is less than 25 micrometers, where $P_{pixel}$ is a distance between adjacent said pixel units, $P_{SFPS}$ is a distance between adjacent said sub-fingerprint recognition units.

In some embodiments of the present disclosure, the display panel further includes: a thin film encapsulation layer disposed on the display substrate; a first insulating layer disposed on the thin film encapsulation layer; a first metal layer disposed on the first insulating layer; a second insulating layer disposed on the first metal layer, and provided with at least one via hole; a second metal layer disposed on the second insulating layer and connected with the first metal layer by the via hole; and a third insulating layer disposed on the second metal layer.

In some embodiments of the present disclosure, the first metal layer is touch sensing electrodes or touch driving electrodes in the touch layer, and is fingerprint recognition bridging metal traces in the fingerprint recognition layer; the second metal layer is fingerprint recognition sensing electrodes or fingerprint recognition driving electrodes in the fingerprint recognition layer, and is touch bridging metal traces or dummy electrodes in the touch layer; the fingerprint recognition bridging metal traces connect with adjacent said fingerprint recognition sensing electrodes or fingerprint recognition driving electrodes; the touch bridging metal traces connect with adjacent said touch sensing electrodes or said touch driving electrodes, and the dummy electrodes cover the pixel units.

In some embodiments of the present disclosure, shapes of the fingerprint recognition bridging metal traces are isometric enlarged patterns of corresponding outline of the pixel units, or straight-line shape.

In some embodiments of the present disclosure, the first metal layer is a non-transparent material, including at least one of gold, silver, copper, lithium, sodium, potassium, magnesium, aluminum, and zinc, and the first metal layer is disposed between adjacent said pixel units.

In some embodiments of the present disclosure, the second metal layer is a transparent conductive material, including a first indium tin oxide layer, a silver layer, and a second indium tin oxide layer which are stacked; the first indium tin oxide layer and the second indium tin oxide layer have a thickness being from 5 nanometers to 20 nanometers, and the silver layer has a thickness being from 5 nanometers to 30 nanometers.

In a second aspect, the present disclosure further provides a display device, comprising a display panel, the display panel comprising: a display substrate, the display substrate including a plurality of pixel units; and a touch layer and a fingerprint recognition layer disposed on the display substrate; wherein, the touch layer includes at least one touch unit; the fingerprint recognition layer includes at least one primary fingerprint recognition unit, and each of the primary fingerprint recognition units includes $N_{SFPS}$ sub-fingerprint recognition units corresponding to $N_{pixel}$ said pixel units, where $N_{SFPS}$ and $N_{pixel}$ are positive integers.

In some embodiments of the present disclosure, the touch layer and the fingerprint recognition layer are disposed in the same layer.

In some embodiments of the present disclosure, a distance between adjacent said touch units is from 5 millimeters to 20 millimeters, and a distance between adjacent said sub-fingerprint recognition units is from 50 micrometers to 150 micrometers.

In some embodiments of the present disclosure, a distance $P_{UFPS}$ between adjacent said primary fingerprint identification units satisfies $P_{UFPS}=N_{pixel}\times P_{pixel}$ or $P_{UFPS}=N_{SFPS}\times P_{SFPS}$, and a difference between $N_{pixel}\times P_{pixel}$ and $N_{SFPS}\times P_{SFPS}$ is less than 25 micrometers, where $P_{pixel}$ is a distance between adjacent said pixel units, $P_{SFPS}$ is a distance between adjacent said sub-fingerprint recognition units.

In some embodiments of the present disclosure, the display panel further includes: a thin film encapsulation layer disposed on the display substrate; a first insulating layer disposed on the thin film encapsulation layer; a first metal layer disposed on the first insulating layer; a second insulating layer disposed on the first metal layer, and provided with at least one via hole; a second metal layer disposed on the second insulating layer and connected with the first metal layer by the via hole; and a third insulating layer disposed on the second metal layer.

In some embodiments of the present disclosure, the first metal layer is touch sensing electrodes or touch driving electrodes in the touch layer, and is fingerprint recognition bridging metal traces in the fingerprint recognition layer; the second metal layer is fingerprint recognition sensing electrodes or fingerprint recognition driving electrodes in the fingerprint recognition layer, and is touch bridging metal traces or dummy electrodes in the touch layer; the fingerprint recognition bridging metal traces connect with adjacent said fingerprint recognition sensing electrodes or fingerprint recognition driving electrodes; the touch bridging metal traces connect with adjacent said touch sensing electrodes or said touch driving electrodes, and the dummy electrodes cover the pixel units.

In some embodiments of the present disclosure, shapes of the fingerprint recognition bridging metal traces are isometric enlarged patterns of corresponding outline of the pixel units, or straight-line shape.

In some embodiments of the present disclosure, the first metal layer is a non-transparent material, including at least one of gold, silver, copper, lithium, sodium, potassium, magnesium, aluminum, and zinc, and the first metal layer is disposed between adjacent said pixel units.

In some embodiments of the present disclosure, the second metal layer is a transparent conductive material, including a first indium tin oxide layer, a silver layer, and a second indium tin oxide layer which are stacked; the first indium tin oxide layer and the second indium tin oxide layer have a thickness being from 5 nanometers to 20 nanometers, and the silver layer has a thickness being from 5 nanometers to 30 nanometers.

Beneficial Effect

Compared with the conventional display panel, in the present disclosure, the fingerprint recognition layer and the touch layer are disposed in the same layer, and the patterns of the fingerprint recognition units redesigned for different distances between adjacent pixel units in the display panels with different resolutions, such that there are an integer number of pixel units and an integer number of sub-fingerprint recognition units in the same primary fingerprint recognition unit, and the distances between said adjacent sub-fingerprint recognition units are in an optimal recognition extent, thereby reducing a limitation of the different distances between said adjacent pixel units for the on-cell fingerprint recognition unit. Moreover, the shape of the bridging metal traces is changed, the impact on the light emission of the pixel unit is reduced, and the screen-to-body ratio of the light-emitting area is increased. It is extremely helpful for the fingerprint recognition sensor to be integrated by means of an on-cell type within the display device, and user experience is also greatly improved.

DESCRIPTION OF DRAWINGS

To clearly illustrate the embodiments of the present disclosure or the technical solution in the prior art, accompanying drawings for describing the embodiments or the prior art are simply introduced in the following content. Apparently, the accompanying drawings described below are only some embodiments of the present disclosure. A person of ordinary skill in the art, without creative efforts, can derive other drawings from these drawings.

DETAILED DESCRIPTION OF PREFERRED EMBODIMENTS

Figure 1:
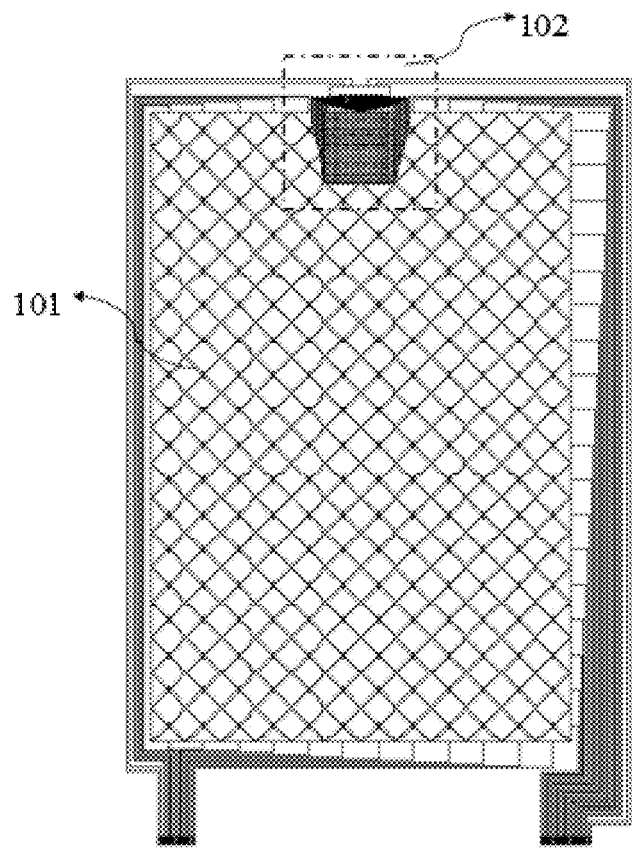
FIG. 1 is a schematic diagram of a display panel in an embodiment of the present disclosure.

The technical solutions in the embodiments of the present disclosure is clearly and completely described below in conjunction with the drawings in the embodiments of the present disclosure. Obviously, the described embodiments are only a part of the embodiments of the present disclosure, rather than all the embodiments. Based on the embodiments of the present disclosure, all other embodiments obtained by those skilled in the art without creative work shall be within the protection scope of the present disclosure.

In the description of the present disclosure, it should be understood that the terms "center", "longitudinal", "transverse", "length", "width", "thickness", "upper", "lower", "front", "back", "left", "right", "vertical", "horizontal", "top", "bottom", "inner", "outer", "clockwise", "counterclockwise", etc., by which the orientation or positional relationship indicated are based on the orientation or positional relationship shown in the drawings, and are only for the convenience of describing the present disclosure and simplifying the description, rather than indicating or implying that the pointed device or element must have a specific orientation, be constructed and operated in a specific orientation, and therefore cannot be understood as a limitation of the present disclosure. In addition, the terms "first" and "second" are only used for descriptive purposes and cannot be understood as indicating or implying relative importance or implicitly indicating the number of indicated technical features. Therefore, the features defined with "first" and "second" may explicitly or implicitly include one or more of the features. In the description of the present disclosure, "plurality" means two or more, unless otherwise specifically defined.

A fingerprint recognizer is assembled as an individual module, which affects the ratio of the front display, and the internal space of the whole machine in the prior art.

Based on this, embodiments of the present disclosure provide a display panel and a display device. Detailed descriptions are given below.

Firstly, an embodiment of the present disclosure provides a display panel. As shown in FIG. 1, FIG. 1 is a schematic diagram of the display panel in an embodiment of the present disclosure. The display panel includes: a display substrate 100, the display substrate includes a plurality of pixel units 103; and a touch layer 101 and a fingerprint recognition layer 102 disposed on the display substrate; wherein, the touch layer 102 includes at least one touch unit; the fingerprint recognition layer includes at least one primary fingerprint recognition unit, and each of the primary fingerprint recognition units includes $N_{SFPS}$ sub-fingerprint recognition units corresponding to $N_{pixel}$ said pixel units 103, where $N_{SFPS}$ and $N_{pixel}$ are positive integers.

Compared with the conventional display panel, in the present disclosure, the patterns of the fingerprint recognition units are redesigned for the different distances between said adjacent pixel units 103 in the display panel with different resolutions, such that there are an integer number of pixel units 103 and an integer number of sub-fingerprint recognition units in the same primary fingerprint recognition unit, and the distances between said adjacent sub-fingerprint recognition units are in the optimal recognition extent, thereby reducing a limitation of the different distances between said adjacent pixel units 103 for the on-cell fingerprint recognition unit. It is extremely helpful for the fingerprint recognition sensor to be integrated by means of an on-cell type in the display device, and the user experience is also greatly improved.

In the embodiment of the present invention, the touch layer 101 and the fingerprint recognition layer 102 are disposed in the same layer. The display panel is divided into a fingerprint recognition area and a touch area. The positions of the fingerprint recognition area and the touch layer 102 are both located on the short sides of the display panel, and are respectively located on the two opposite short sides.

Figure 2:
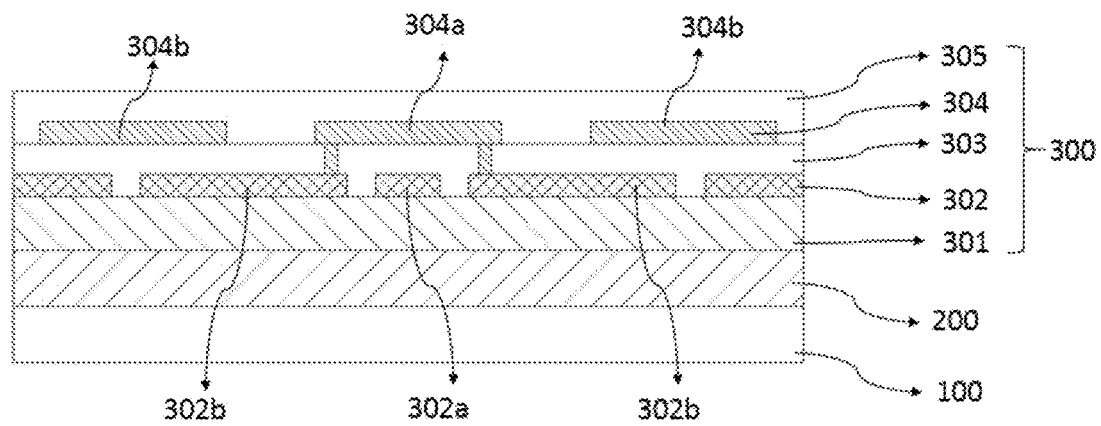
FIG. 2 is a structurally schematic diagram of a touch layer in an embodiment of the present disclosure.
Figure 3:
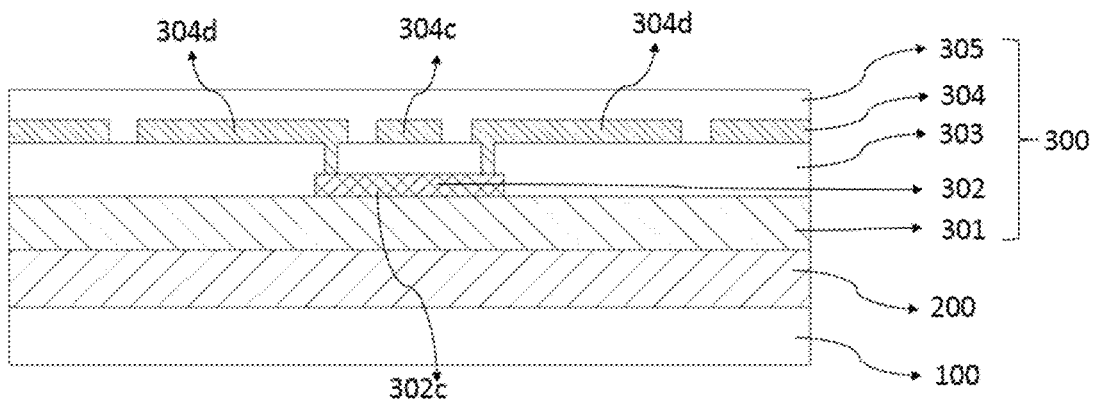
FIG. 3 is a structurally schematic diagram of a fingerprint recognition layer in an embodiment of the present disclosure.

As shown in FIG. 2 and FIG. 3, FIG. 2 is a structurally schematic diagram of the touch layer in an embodiment of the present disclosure. FIG. 3 is a structurally schematic diagram of a fingerprint recognition layer in an embodiment of the present disclosure. The display panel further includes: a thin film encapsulation layer 200 disposed on the display substrate 100; a first insulating layer 301 disposed on the thin film encapsulation layer 200; a first metal layer 302 is disposed on the first insulating layer 301; the second insulating layer 303 disposed on the first metal layer 302 and provided with at least one via hole; the second metal layer 304 disposed on the second insulating layer 303 and connected with the first metal layer by the via holes; and a third insulating layer 305 disposed on the second metal layer 304.

The first metal layer 102 is touch sensing electrodes 302a or touch driving electrodes 302b in the touch layer 101, and is fingerprint recognition bridging metal traces 302c in the fingerprint recognition layer 102; the second metal layer 304 is fingerprint recognition sensing electrodes 304c or fingerprint recognition driving electrodes 304d in the fingerprint recognition layer 102, and is touch bridging metal traces 304a or dummy electrodes 304b in the touch layer 101; the fingerprint recognition bridging metal traces 302c connect with adjacent said fingerprint recognition sensing electrodes 304c or fingerprint recognition driving electrodes 304d; the touch bridging metal traces 304a connect with adjacent said touch sensing electrodes 302a or said touch driving electrodes 302b, and the dummy electrodes 304b cover the pixel units 103.

The touch layer 101 and the fingerprint recognition layer 102 are both single-layer bridging structures. That is, two adjacent said touch sensing electrodes 302a or two adjacent said touch driving electrodes 302b, two adjacent said fingerprint recognition sensing electrode 304c or two adjacent said fingerprint recognition driving electrode 304d are respectively arranged in the same layer. The touch bridging metal traces 304a conduct two adjacent said touch sensing electrodes 302a or two adjacent said touch driving electrodes 302b by the via holes of the second insulating layer 303, and the fingerprint recognition bridging metal traces 302c conduct two adjacent said fingerprint recognition sensing electrode 304c or two adjacent said fingerprint recognition driving electrode 304d by the via holes of the second insulating layer 303, such that the touch sensing electrodes 302a or the touch driving electrodes 302b, the fingerprint recognition sensing electrodes 304c or the fingerprint recognition driving electrodes 304d, which are distributed at intervals form a complete passageway. Wherein the first insulating layer 301, the second insulating layer 303, and the third insulating layer 305 are respectively disposed between the first metal layer 302 and the second metal layer 304 and disposed on both sides of them, for insulating and protecting the first metal layer 302 and the second metal layer 304, preventing the touch sensing electrode 302a from being connected with the touch driving electrode 302b, and preventing the fingerprint recognition sensing electrode 304c from being connected with the fingerprint recognition driving electrode 304d. The dummy electrodes 304b have a large size being larger than the pixel units 103, and cover the pixel units 103 for the purpose of keeping the optical effect of the fingerprint recognition area consistent with the optical effect of the touch area.

The electrodes in the fingerprint recognition layer 102 adopt a mutual capacitance mode, and a first direction and a second direction are not restricted. Therefore, the positions and directions of the fingerprint recognition sensing electrodes 304c and the fingerprint recognition driving electrodes 304d in each figure can be interchanged. It can be understood that, a single-layer bridging method is preferably adopted in the embodiment of the present disclosure, in which the fingerprint recognition sensing electrode 304c and the fingerprint recognition driving electrode 304d are disposed in the same layer, but are not limited to the single-layer bridging method. A double-layer structure may also be adopted, that is, the fingerprint recognition sensing electrode 304c and the fingerprint recognition driving electrode 304d are disposed in different layers, and the touch layer 101 is in the same way.

In the embodiment of the present disclosure, the first metal layer 302 is a non-transparent material, including at least one of gold, silver, copper, lithium, sodium, potassium, magnesium, aluminum, and zinc. The first metal layer 302 is disposed between adjacent said pixel units 103, to prevent non-transparent materials from blocking light emission of the pixel units 103.

Figure 4:
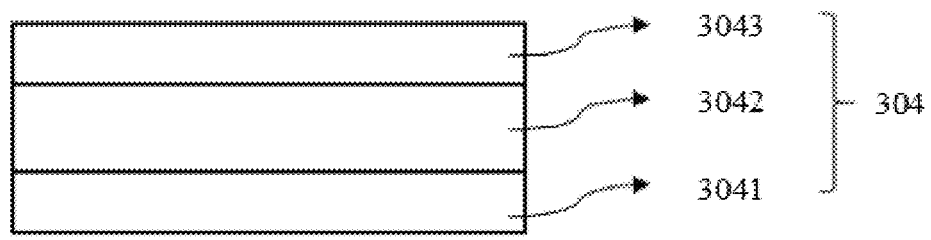
FIG. 4 is a structurally schematic diagram of a second metal layer in an embodiment of the present disclosure.

As shown in FIG. 4, FIG. 4 is a structurally schematic diagram of the second metal layer in an embodiment of the present disclosure. The second metal layer 304 is a transparent conductive material, including a laminated first indium tin oxide layer 3041, a silver layer 3042, and a second indium tin oxide layer 3043. Preferably, the first indium tin oxide layer 3041 and the second indium tin oxide layer 3043 have a thickness being from 5 nanometers to 20 nanometers, and the silver layer 3042 has a thickness being from 5 nanometers to 30 nanometers.

Figure 5:
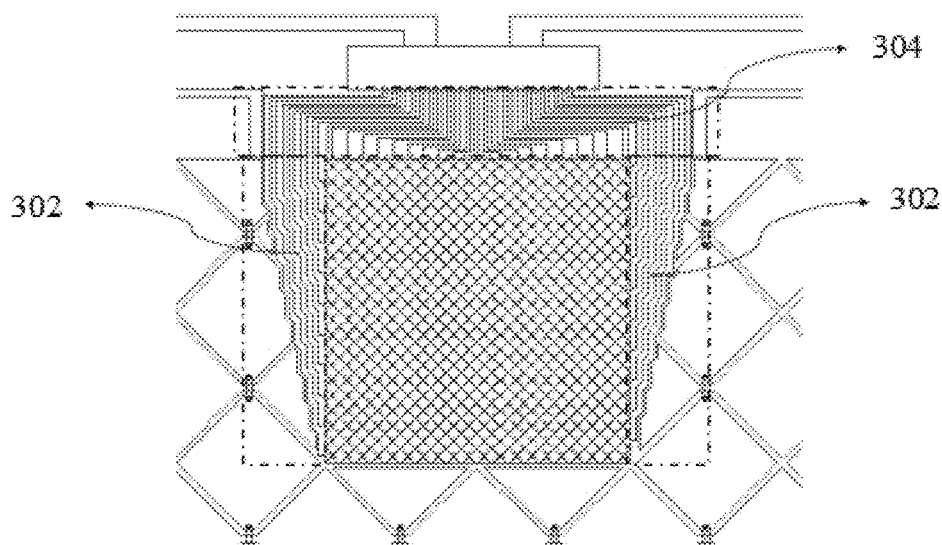
FIG. 5 is a top view of a fingerprint recognition layer in an embodiment of the present disclosure.

As shown in FIG. 5, FIG. 5 is a top view of the fingerprint recognition layer in an embodiment of the present disclosure. The display panel includes a display area and a non-display area. If the fingerprint recognition layer 102 is disposed close to an edge of the display panel, some of the peripheral leads of the fingerprint recognition layer 102 are located in the display area, and some are located in the non-display area. The peripheral leads in the display area are made of transparent said second metal layer 304, and have a width ranging from 5 um to 30 um. A wiring method of the peripheral leads adopts stepped wiring, which an area occupied by the peripheral leads of the fingerprint recognition layer 102 is minimized, used to reduce the influence of the peripheral leads within the display area of the panel to the touch patterns. The peripheral leads in the non-display area are made of non-transparent said first metal layer 302, to reduce wiring resistance of the leads. In the embodiment, the integrated circuit (IC) of the fingerprint recognition layer 102 is directly bonded to the display panel, and the integrated circuit of the fingerprint recognition layer 102 may also be bonded to a flexible printed circuit (FPC) using a chip on film (COF) method.

Figure 6:
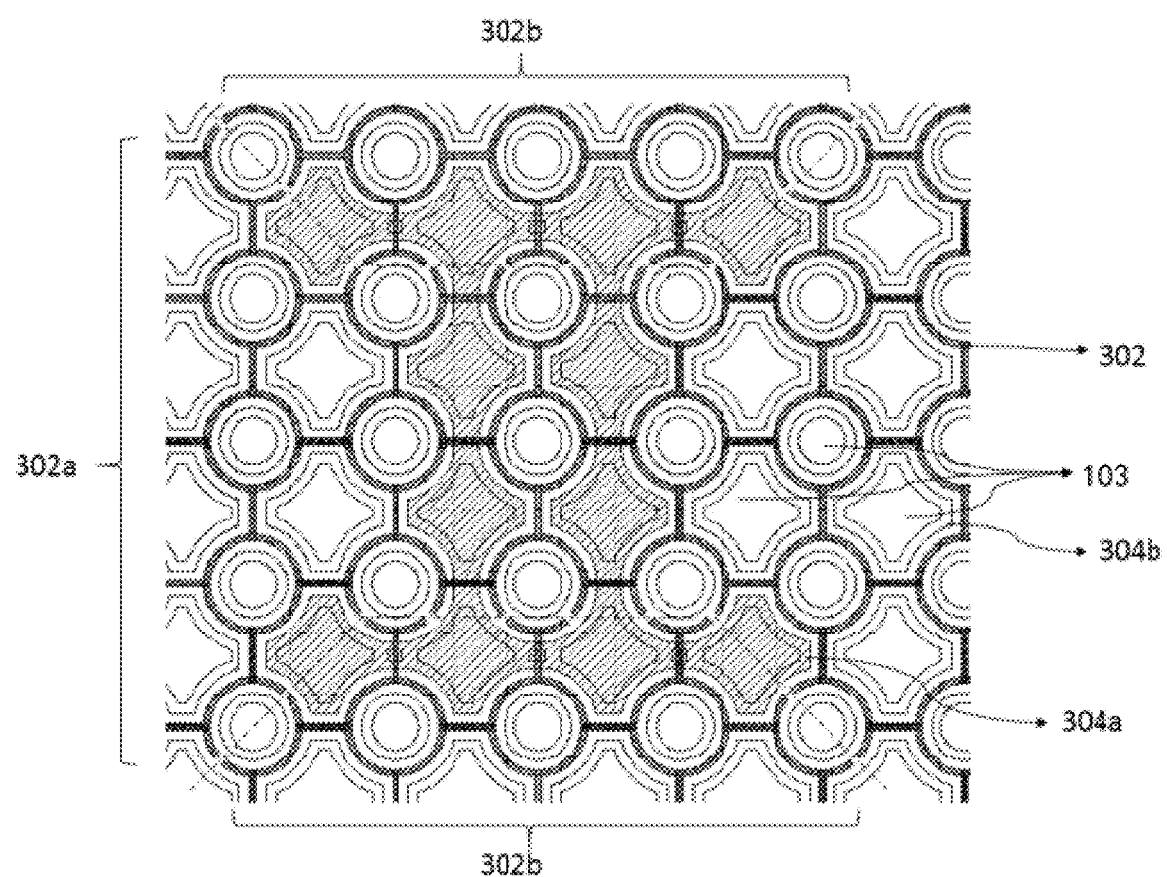
FIG. 6 is a top view of a touch layer in an embodiment of the invention.

As shown in FIG. 6, FIG. 6 is a top view of the touch layer in an embodiment of the present disclosure. In the embodiment, the electrodes in the longitudinal direction are defined as the touch sensing electrodes 302a, and the electrodes in the lateral direction are defined as the touch driving electrodes 302b. Both the touch sensing electrodes 302a and the touch driving electrodes 302b are made of the first metal layer 302. Since the first metal layer 302 is opaque, the traces of the touch sensing electrode 302a and the touch driving electrode 302b are all arranged between adjacent said pixel units 103, to reduce the impact on light emission for the display area.

Preferably, the patterns of the touch unit and the sub-fingerprint recognition unit are diamond-shape. A distance between adjacent said touch units is from 5 millimeters to 20 millimeters, and a distance between adjacent said sub-fingerprint recognition units is from 50 micrometers to 150 micrometers. In high-resolution products, the distance between adjacent said pixel units 103 is usually within 100 micrometers. Because the distance between adjacent said touch units is much larger than the distance between adjacent said pixel units 103, and a preferable extent is larger, while the distance between adjacent said sub-fingerprint recognition units is smaller, and the preferable extent is smaller, both the first metal layer 302 and the second metal layer 304 in the touch layer 101 can be disposed between adjacent said pixel units 103. If the second metal layer 304 is also disposed between adjacent said pixel units 103 in the fingerprint recognition unit 102, then the preferable extent of the sub-fingerprint recognition units is not satisfied, leading to defects, such as a reduction in fingerprint recognition effect.

Figure 7:
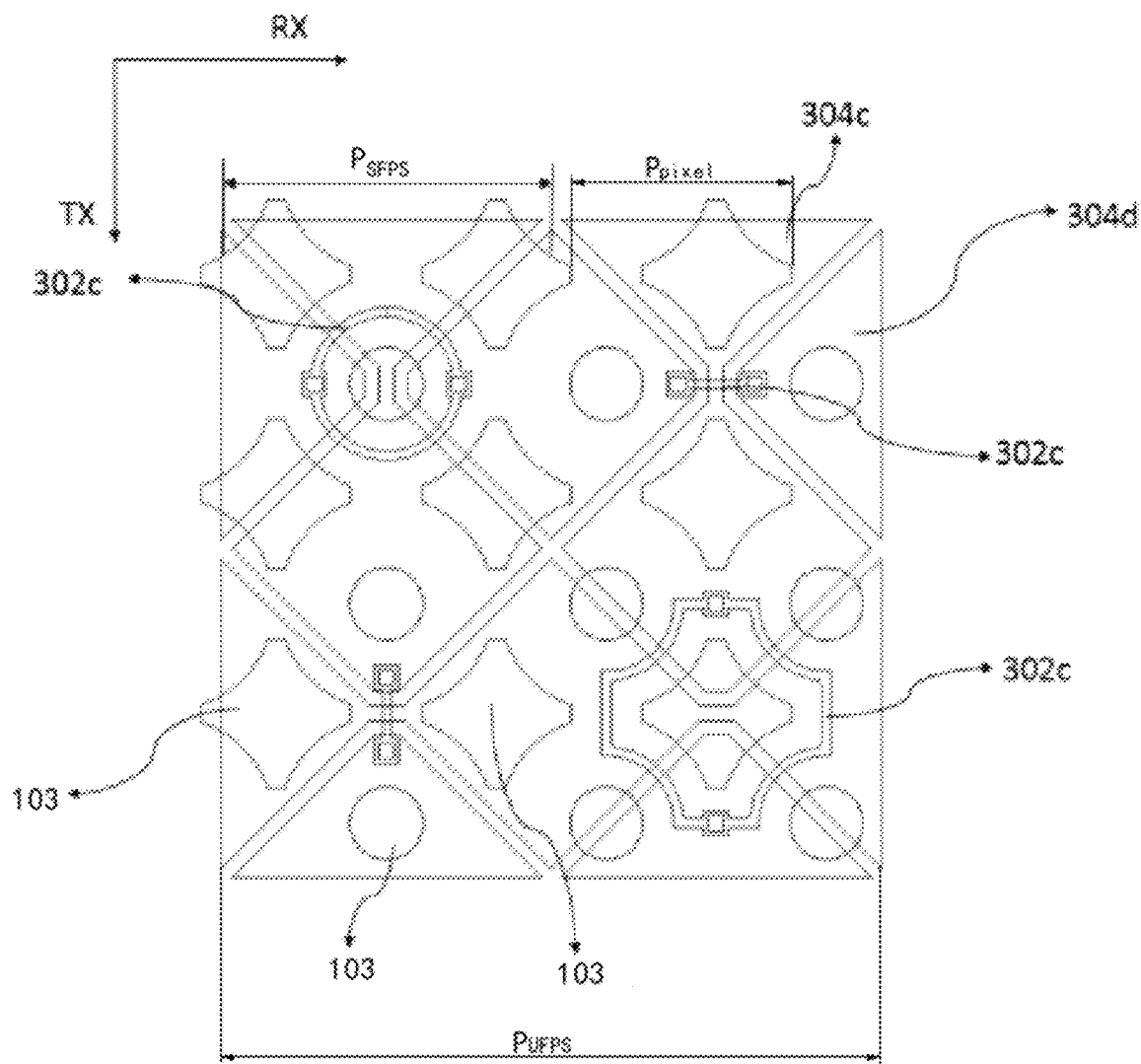
FIG. 7 is a schematic diagram of a primary fingerprint recognition unit in an embodiment of the present disclosure.

To balance a good fingerprint recognition effect and less shielding of the pixel unit 103, an embodiment of the present disclosure provides a setting method of the primary fingerprint recognition unit. As shown in FIG. 7, FIG. 7 is a schematic diagram of a primary fingerprint recognition unit in an embodiment of the present disclosure. A distance $P_{UFPS}$ between adjacent said primary fingerprint identification units satisfies $P_{UFPS}=N_{pixel} \times P_{pixel}$ or $P_{UFPS}=N_{SFPS} \times P_{SFPS}$, and a difference between $N_{pixel} \times P_{pixel}$ and $N_{SFPS} \times P_{SFPS}$ is less than 25 micrometers, where $P_{pixel}$ is a distance between adjacent said pixel units 103, $P_{SFPS}$ is a distance between adjacent said sub-fingerprint recognition units. That is, without affecting the fingerprint recognition effect and completely avoiding overlapping, by disposing a different numbers of the pixel units 103 and the sub-fingerprint recognition units in one primary fingerprint recognition unit, the second metal layer 304 being as many as possible disposed between adjacent said pixel units 103, and the second metal layer 304 passing through the pixel units 103 being as small as possible are achieved. Since the first metal layer 301 is opaque, in order to prevent the first metal layer 302 from blocking light emission of the pixel unit 103, the fingerprint recognition bridging metal layer 302c in the fingerprint recognition layer 102 is not only directly connected in straight line shape, but also includes an isometric enlarged pattern designed according to the corresponding outline of the pixel unit 103. As shown in the figures, the pixel unit 103 includes circular green pixel units, and special-shaped red pixel units and blue pixel units with four extensions. The fingerprint recognition bridging metal traces 302c are designed based upon the shape of the pixel unit 103. For example, they are designed as larger circles, special shapes or straight light shapes also having four extensions, and are conducted through the periphery of the pixel unit 103. As shown in FIG. 7, the patterns conducted in the lateral direction RX are defined as the fingerprint recognition driving electrode 304d, and the patterns conducted in the longitudinal direction TX are defined as the fingerprint recognition sensing electrode 304c. There are said fingerprint recognition bridging metal traces 302c conducted laterally, and there are also said fingerprint recognition bridging metal traces 302c connected longitudinally in the same primary fingerprint recognition unit.

To better implement the display panel in the embodiment of the present disclosure, based on the display panel, an embodiment of the present disclosure also provides a display device. The display device includes the display panel as described in the foregoing embodiment. The performance of the display device is further improved by adopting the display panel described in the above embodiment.

In the above embodiments, the description of each embodiment has its own emphasis. For a part that is not detailed in an embodiment, the related descriptions of other embodiments can be referred. Each of the above units or structures can be implemented as an independent entity, or can be combined arbitrarily and implemented as the same or several entities when being implemented. The specific implementation of each of the above units or structures can be referred to the previous method embodiments, and is not repeated herein.

The embodiments of the present disclosure are introduced in detail above. Specific examples are applied to set forth the principles and implementation of the present disclosure herein. The above descriptions of examples are only intended to help the understanding of the technical solution and the idea of the present disclosure. It should be understood that for those skilled in the art: modifications still may be made to the technical solutions described in the foregoing embodiments, or equivalent substitutions may be made to some of the technical features thereof. These modifications or substitutions do not make the essence of the corresponding technical solutions depart from the scope of the technical solutions of the embodiments of the present disclosure.

What is claimed is:

1. A display panel, comprising:
   a display substrate, the display substrate including a plurality of pixel units;
   a touch layer and a fingerprint recognition layer disposed on the display substrate,
   wherein the touch layer includes one or more touch units, the fingerprint recognition layer includes one or more primary fingerprint recognition units, and each of the primary fingerprint recognition units includes $N_{SFPS}$ sub-fingerprint recognition units corresponding to $N_{pixel}$ ones of the pixel units, where $N_{SFPS}$ and $N_{pixel}$ are positive integers;
   a thin film encapsulation layer disposed on the display substrate;
   a first insulating layer disposed on the thin film encapsulation layer;
   a first metal layer disposed on the first insulating layer;
   a second insulating layer disposed on the first metal layer and provided with at least one via hole;
   a second metal layer disposed on the second insulating layer and connected with the first metal layer by the via hole; and
   a third insulating layer disposed on the second metal layer.

2. The display panel according to claim 1, wherein the touch layer and the fingerprint recognition layer are disposed in the same layer.

3. The display panel according to claim 1, wherein a distance between adjacent ones of the touch units is from 5 millimeters to 20 millimeters, and a distance between adjacent ones of the sub-fingerprint recognition units is from 50 micrometers to 150 micrometers.

4. The display panel according to claim 1, wherein a distance $P_{UFPS}$ between adjacent ones of the primary fingerprint identification units satisfies $P_{UFPS}=N_{pixel}\times P_{pixel}$ or $P_{UFPS}=N_{SFPS}\times P_{SFPS}$, and a difference between $N_{pixel}\times P_{pixel}$ and $N_{SFPS}\times P_{SFPS}$ is less than 25 micrometers, where $P_{pixel}$ is a distance between adjacent ones of the pixel units, and $P_{SFPS}$ is a distance between adjacent ones of the sub-fingerprint recognition units.

5. The display panel according to claim 1, wherein the first metal layer is touch sensing electrodes or touch driving electrodes in the touch layer, and is fingerprint recognition bridging metal traces in the fingerprint recognition layer; the second metal layer is fingerprint recognition sensing electrodes or fingerprint recognition driving electrodes in the fingerprint recognition layer, and is touch bridging metal traces or dummy electrodes in the touch layer; the fingerprint recognition bridging metal traces connect adjacent ones of the fingerprint recognition sensing electrodes or adjacent ones of the fingerprint recognition driving electrodes; the touch bridging metal traces connect adjacent ones of the touch sensing electrodes or adjacent ones of the touch driving electrodes, and the dummy electrodes cover the pixel units.

6. The display panel according to claim 5, wherein shapes of the fingerprint recognition bridging metal traces are isometric enlarged patterns of corresponding outline of the pixel units, or straight-line shape.

7. The display panel according to claim 1, wherein the first metal layer is a non-transparent material, including at least one of gold, silver, copper, lithium, sodium, potassium, magnesium, aluminum, or zinc, and the first metal layer is disposed between adjacent ones of the pixel units.

8. The display panel according to claim 1, wherein the second metal layer is a transparent conductive material, including a first indium tin oxide layer, a silver layer, and a second indium tin oxide layer which are stacked; the first indium tin oxide layer and the second indium tin oxide layer have a thickness of 5 nanometers to 20 nanometers, and the silver layer has a thickness of 5 nanometers to 30 nanometers.

9. A display device, comprising a display panel, the display panel comprising:
   a display substrate, the display substrate including a plurality of pixel units;
   a touch layer and a fingerprint recognition layer disposed on the display substrate, wherein, the touch layer includes one or more touch units, the fingerprint recognition layer includes one or more primary fingerprint recognition units, and each of the primary fingerprint recognition units includes $N_{SFPS}$ sub-fingerprint recognition units corresponding to $N_{pixel}$ ones of the pixel units, wherein $N_{SFPS}$ and $N_{pixel}$ are positive integers;
   a thin film encapsulation layer disposed on the display substrate;
   a first insulating layer disposed on the thin film encapsulation layer;
   a first metal layer disposed on the first insulating layer;
   a second insulating layer disposed on the first metal layer and provided with at least one via hole;
   a second metal layer disposed on the second insulating layer and connected with the first metal layer by the via hole; and
   a third insulating layer disposed on the second metal layer.

10. The display device according to claim 9, wherein the touch layer and the fingerprint recognition layer are disposed in the same layer.

11. The display device according to claim 9, wherein a distance between adjacent ones of the touch units is from 5 millimeters to 20 millimeters, and a distance between adjacent ones of the sub-fingerprint recognition units is from 50 micrometers to 150 micrometers.

12. The display device according to claim 9, wherein a distance $P_{UFPS}$ between adjacent ones of the primary fingerprint identification units satisfies $P_{UFPS}=N_{pixel}\times P_{pixel}$ or $P_{UFPS}=N_{SFPS}\times P_{SFPS}$, and a difference between $N_{pixel}\times P_{pixel}$ and $N_{SFPS}\times P_{SFPS}$ is less than 25 micrometers, where $P_{pixel}$ is a distance between adjacent ones of the pixel units, and $P_{SFPS}$ is a distance between adjacent ones of the sub-fingerprint recognition units.

13. The display device according to claim 9, wherein the first metal layer is touch sensing electrodes or touch driving electrodes in the touch layer, and is fingerprint recognition bridging metal traces in the fingerprint recognition layer; the second metal layer is fingerprint recognition sensing electrodes or fingerprint recognition driving electrodes in the fingerprint recognition layer, and is touch bridging metal traces or dummy electrodes in the touch layer; the fingerprint recognition bridging metal traces connect adjacent ones of the fingerprint recognition sensing electrodes or adjacent ones of the fingerprint recognition driving electrodes; the touch bridging metal traces connect adjacent ones of the touch sensing electrodes or adjacent ones of the touch driving electrodes, and the dummy electrodes cover the pixel units.

14. The display device according to claim 13, wherein shapes of the fingerprint recognition bridging metal traces are isometric enlarged patterns of corresponding outline of the pixel units, or straight-line shape.

15. The display device according to claim 9, wherein the first metal layer is a non-transparent material, including at least one of gold, silver, copper, lithium, sodium, potassium, magnesium, aluminum, or zinc, and the first metal layer is disposed between adjacent ones of the pixel units.

16. The display device according to claim 9, wherein the second metal layer is a transparent conductive material, including a first indium tin oxide layer, a silver layer, and a second indium tin oxide layer which are stacked; the first indium tin oxide layer and the second indium tin oxide layer have a thickness of 5 nanometers to 20 nanometers, and the silver layer has a thickness of 5 nanometers to 30 nanometers.

17. A display panel, comprising:
a display substrate, the display substrate including a plurality of pixel units; and
a touch layer and a fingerprint recognition layer disposed on the display substrate, wherein the touch layer includes one or more touch units, the fingerprint recognition layer includes one or more primary fingerprint recognition units, and each of the primary fingerprint recognition units includes $N_{SFPS}$ sub-fingerprint recognition units corresponding to $N_{pixel}$ ones of the pixel units, where $N_{SFPS}$ and $N_{pixel}$ are positive integers; and
wherein a distance $P_{UFPS}$ between adjacent ones of the primary fingerprint identification units satisfies $P_{UFPS}=N_{pixel} \times P_{pixel}$ or $P_{UFPS}=N_{SFPS} \times P_{SFPS}$, and a difference between $N_{pixel} \times P_{pixel}$ and $N_{SFPS} \times P_{SFPS}$ is less than 25 micrometers, where $P_{pixel}$ is a distance between adjacent ones of the pixel units, and $P_{SFPS}$ is a distance between adjacent ones of the sub-fingerprint recognition units.

18. The display panel according to claim 17, wherein the touch layer and the fingerprint recognition layer are disposed in the same layer.

19. The display panel according to claim 17, herein a distance between adjacent ones of the touch units is from 5 millimeters to 20 millimeters, and a distance between adjacent ones of the sub-fingerprint recognition units is from 50 micrometers to 150 micrometers.

* * * * *